(12) United States Patent
Lin

(10) Patent No.: US 8,574,452 B2
(45) Date of Patent: Nov. 5, 2013

(54) HEAT DISSIPATION COMPOSITION

(75) Inventor: Ku-Hua Lin, Lu-Chou (TW)

(73) Assignee: Sequoia Radcure Co., Ltd., Lu-Chou (TW)

( * ) Notice: Subject to any disclaimer, the term of this patent is extended or adjusted under 35 U.S.C. 154(b) by 336 days.

(21) Appl. No.: 12/846,840

(22) Filed: Jul. 30, 2010

(65) Prior Publication Data

US 2012/0025133 A1 Feb. 2, 2012

(51) Int. Cl.
*C09K 5/00* (2006.01)
(52) U.S. Cl.
USPC .............................. 252/70; 252/71; 252/72
(58) Field of Classification Search
None
See application file for complete search history.

(56) References Cited

U.S. PATENT DOCUMENTS

2010/0163783 A1* 7/2010 Fung et al. ...................... 252/73

* cited by examiner

*Primary Examiner* — Necholus Ogden, Jr.
(74) *Attorney, Agent, or Firm* — Leong C. Lei

(57) ABSTRACT

A heat dissipation composition includes a hydroxy function group contained double-bond substance (such as 2-hydroxybenzophenone, 2-hydroxydibenzoacid, and alkyl 2-cyano-3, 3-diphenylacrylate) formed of aromatic hydrocarbons having precursor of benzene, which is mixed with a resin-based coating agent and a diluting agent at predetermined ratios for application on a surface of a heat dissipater to facilitate heat dissipation, whereby when the heat dissipater receives heat to be dissipated, the double-bond substance absorbs the heat and induces displacement to form a resonance structure so as to more efficiently dissipate the heat and when the heat is dissipated, the substance restores the double-bond condition thereby realizing improvement of efficiency of heat dissipation.

8 Claims, 5 Drawing Sheets

HEAT DISSIPATION COMPOSITION

TECHNICAL FIELD OF THE INVENTION

The present invention generally relates to a heat dissipation composition, which is formed of a specific double-bond substance that is mixed with a resin-based coating agent and a diluting agent for application on a surface of a heat dissipater to facilitate heat dissipation, whereby when the heat dissipater receives heat to be dissipated, the double-bond substance absorbs the heat and induces displacement to form a resonance structure so as to more efficiently dissipate the heat and when the heat is dissipated, the substance restores the double-bond condition thereby enhancing the performance of heat dissipation as a novel technique in this field.

DESCRIPTION OF THE PRIOR ART

Various electronic devices contained in electrical appliances and/or electronic facilities, such as a central processing unit (CPU) of a computer and a high power light-emitting diode (LED), are sensitive to the heat generated by the operation thereof. Although the heat is generated by the operation of the device itself, the heat will quickly burn out the device if the heat is not dissipated through a heat dissipater properly installed on the device.

Only under the condition of excellent heat dissipation rate can electronic devices of this kind be operating properly and maintaining a proper lifespan. Conventionally, such an electronic device that generates heat through the operation thereof is provided with a heat dissipater that is composed of a dissipation board or fins. Through high heat dissipation characteristics of the material that makes the heat dissipater or expanded heat dissipation surface area provided by the particular configuration of the heat dissipater, the electronic device that generates heat during the operation thereof is kept at a proper operation temperature. Nevertheless, with the progress and development of the electronic industry, electronic devices are made miniaturized but providing an enlarged power. This makes the conventional way of heat dissipation that is realized through the high heat dissipation characteristics of material of the heat dissipater or even increased heat dissipation surface area provided with particularly designed configuration no longer workable for handling the amount of heat generated by the electronic device.

In view of the fact that the existing structure and configuration of heat dissipater adopted in the electrical/electronic appliances can hardly be further improved in respect of the heat dissipation performance thereof, in order to meet the needs of the newly developed electrical/electronic devices that are of increased power, the present invention aims to provide a heat dissipation composition that improves the performance of heat dissipation for such devices.

SUMMARY OF THE INVENTION

The primary objective of the present invention is to provide a heat dissipation composition that comprises a hydroxy function group contained double-bond substance formed of aromatic hydrocarbons having precursor of benzene, such as 2-hydroxybenzophenone, 2-hydroxydibenzoacid, and alkyl 2-cyano-3,3-diphenylacrylate, which is mixed with a resin-based coating agent and a diluting agent for application on a surface of a heat dissipater to facilitate heat dissipation, whereby when the heat dissipater receives heat to be dissipated, the double-bond substance absorbs the heat and induces displacement to form a resonance structure so as to more efficiently dissipate the heat and when the heat is dissipated, the substance restores the double-bond condition thereby realizing improvement of the efficiency of heat dissipation.

Further, according to the present invention, the resin based coating agent mixed in the double-bond substance can be of the following types:

(1) The resin-based coating agent comprises a roller coating type resin, which is applicable to a roller coating machine for rolling and coating on a plate-like heat dissipater.

(2) The resin-based coating agent comprises a lamination coating type resin, which is applicable to a lamination coating machine for laminating and coating on a plate-like heat dissipater.

(3) The resin-based coating agent comprises a spray coating type resin, which is applicable to a spray coating machine for spraying and coating on a heat dissipater.

(4) The resin-based coating agent comprises an electro-deposition coating type resin, which is mixed with aqueous diluting agent for application in an electro-deposition bath for electroplating a heat dissipater.

The heat dissipation composition according to the present invention can be widely applied to heat dissipation fins made of extrusion and casting of aluminum and aluminum boards, such as #5052 material for backlight module of television and surface-coated rolled steel material, and surface heat dissipation treatment or heat conductive bonding agent of MCPCB, and allows for adjustment of physical and chemical property according to material specification, providing excellent flexibility. For example, the currently available extruded parts can be treated with anodizing and SST is improved from being less than 24 hours to being greater than 96 hours and QUT is made greater than 200 hours ΔE 1.0. The material property is improved, except for environmental protection. The anodized film is thin and of low insulation, making it being of high risk. The novel heat dissipation coating film is of a great thickness, good resilience, high insulation, and low risk. Further, conventional products of CNT/BN/AlN systems have an outside appearance that is rough and has questionable temperature uniformity characteristics. A product made with the composition according to the present invention can shows a transparent and smooth appearance that is of excellent temperature uniformity characteristics, serving as a more effective solution of heat dissipation for the industry.

The foregoing objectives and summary provide only a brief introduction to the present invention. To fully appreciate these and other objects of the present invention as well as the invention itself, all of which will become apparent to those skilled in the art, the following detailed description of the invention and the claims should be read in conjunction with the accompanying drawings. Throughout the specification and drawings identical reference numerals refer to identical or similar parts.

Many other advantages and features of the present invention will become manifest to those versed in the art upon making reference to the detailed description and the accompanying sheets of drawings in which a preferred structural embodiment incorporating the principles of the present invention is shown by way of illustrative example.

DETAILED DESCRIPTION OF THE PREFERRED EMBODIMENTS

The following descriptions are exemplary embodiments only, and are not intended to limit the scope, applicability or configuration of the invention in any way. Rather, the following description provides a convenient illustration for implementing exemplary embodiments of the invention. Various changes to the described embodiments may be made in the function and arrangement of the elements described without departing from the scope of the invention as set forth in the appended claims.

Figure 1:
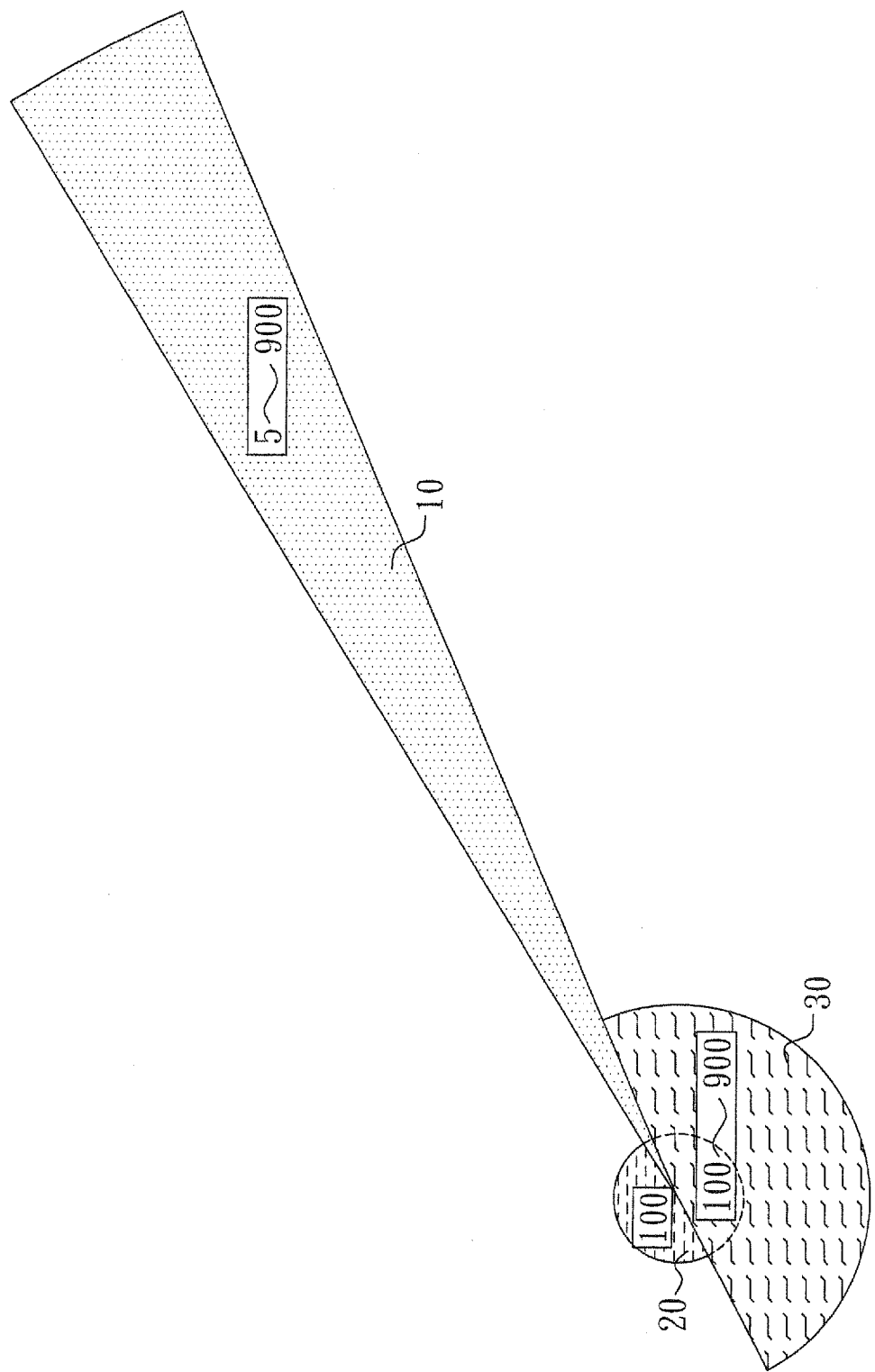
FIG. 1 is a chart showing the ratio among various constituent components of a heat dissipation composition according to the present invention.

FIG. 1 is a chart showing the ratio among various constituent components of a heat dissipation composition according to the present invention. As seen from the chart, the heat dissipation composition according to the present invention comprises a double-bond substance 10 (such as 2-hydroxybenzophenone, 2-hydroxydibenzoacid, and alkyl 2-cyano-3,3-diphenylacrylate) that contains hydroxy function group and is formed of aromatic hydrocarbons having precursor of benzene. The double-bond substance 10 is mixed with a resin-based coating agent 20 and a diluting agent 30. The ratio among the constituent components is as follows. Taking the amount of the coating agent 20 as 100 parts to serve as a reference, the double-bond substance 10 is approximately 5-100 parts. In other words, the ratio between the double-bond substance 10 and the coating agent 20 is 5-100:100. The diluting agent 30, which is preferably aqueous, is approximately 100-900. In other words, the ratio between the diluting agent 30 and the coating agent 20 is 100-900:100. Increasing the ratio between the double-bond substance 10 and the coating agent 20 to a level of 120:100 will lead to problems of excessive viscosity, high cost, and being hard to handle.

A mixture liquid of the double-bond substance 10, the coating agent 20, and the diluting agent 30 is applicable to a surface of a heat dissipater can help heat dissipation of the heat dissipater. This is because that when the heat dissipater receives heat to be dissipated, the double-bond substance is broken by the heat and thus absorbs the heat to induce displacement of bond and foam a resonance structure so as to more efficiently dissipate the heat and when the heat is dissipated, the substance restores the double-bond condition. For example, 2-hydroxybenzophene shows the following process for heat absorption and dissipation:

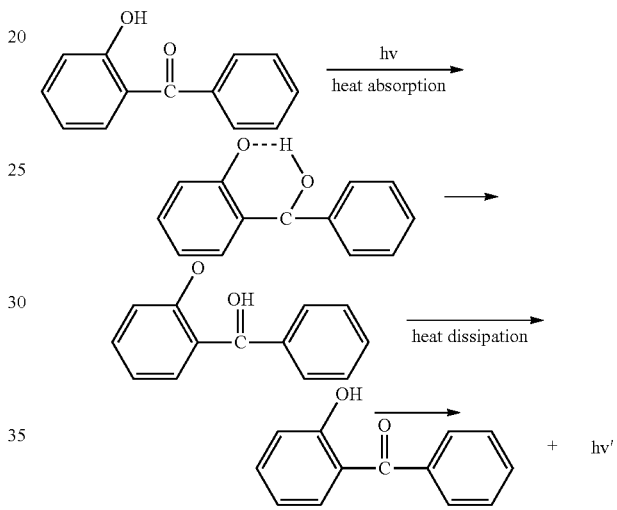

2-hydroxydibenzoacid shows the following process for heat absorption and dissipation;

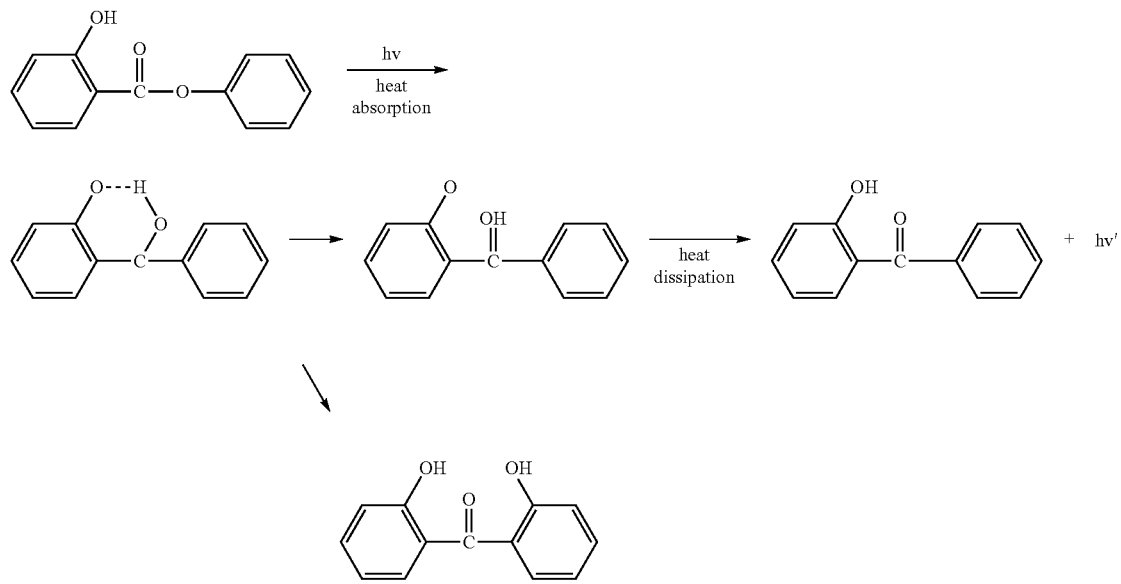

2-(2'-hydroxy)benzotriazole shows the following process of heat absorption and dissipation:

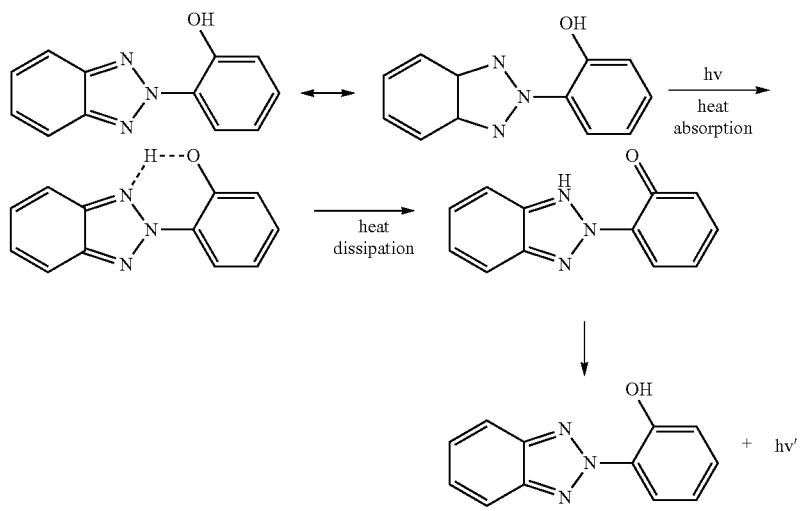

(It is noted that the formula uses the process of the following sequences of heat absorption and resonance of double bond of C and N, displacement, restoration to dissipate heat, so that the more the double bonds of C and N, the better the result of heat dissipation.)

The heat dissipation composition according to the present invention can be widely applied to heat dissipation fins made of extrusion and casting of aluminum and aluminum boards, such as #5052 material for backlight module of television and surface-coated rolled steel material, and surface heat dissipation treatment or heat conductive bonding agent of MCPCB, and allows for adjustment of physical and chemical property according to material specification, providing excellent flexibility. For example, the currently available extruded parts can be treated with anodizing and SST is improved from being less than 24 hours to being greater than 96 hours and QUT is made greater than 200 hours ΔE 1.0. The material property is improved, except for environmental protection. The anodized film is thin and of low insulation, making it being of high risk. The novel heat dissipation coating film is of a great thickness, good resilience, high insulation, and low risk. Further, conventional products of CNT/BN/AlN systems have an outside appearance that is rough and has questionable temperature uniformity characteristics. A product made with the composition according to the present invention can shows a transparent and smooth appearance that is of excellent temperature uniformity characteristics, serving as a more effective solution of heat dissipation for the industry.

Figure 2:
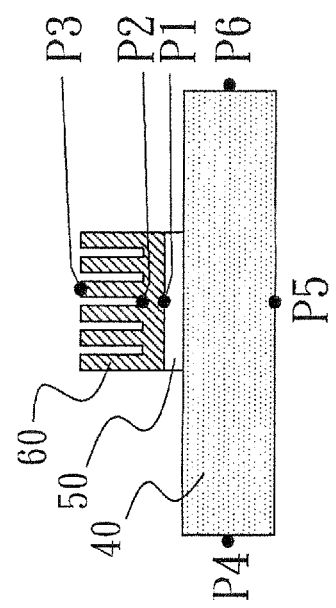
FIG. 2 shows a structure of temperature measurement for the heat dissipation composition according to the present invention.

Tests have been carried out on the composition of the present invention with the following temperature measurement system and reference is made to FIG. 2 that shows the structure of temperature measurement.

| | consumable parts of experiments | specification of module | quantity |
|---|---|---|---|
| 1 | aluminum heat dissipation fin (reference 60 of FIG. 2) | coating sequence number 45101560 | 1 |
| 2 | heating plate (reference 50 of FIG. 2) | $T_{max} < 260°$ C. | 1 |
| 3 | Bakelite board (reference 40 of FIG. 2) | | 1 |

| | equipment | model |
|---|---|---|
| 1 | sorensen | DLM 40-15 |
| 2 | temperature measurement system | measurement time: 4 hr (a sample being take for each interval of 5 seconds), measurement parameter: 5 W |

| measurement points | measurement location | positioning |
|---|---|---|
| P1 | central point of heating plate | on the heating plate (location of reference P1 of FIG. 2) |
| P2 | central point of base of heat dissipation fin | on the aluminum heat dissipation fin |
| P3 | central point of top of heat dissipation fin | on the aluminum heat dissipation fin |
| P4 | left side of heating plate | on the Bakelite board (about 9.7 cm from P1) |
| P5 | underside of heating plate | on the Bakelite board (about 2.5 cm from P1) |
| P6 | right side of heating plate | on the Bakelite board (about 9.7 cm from P1) |

Figure 3:
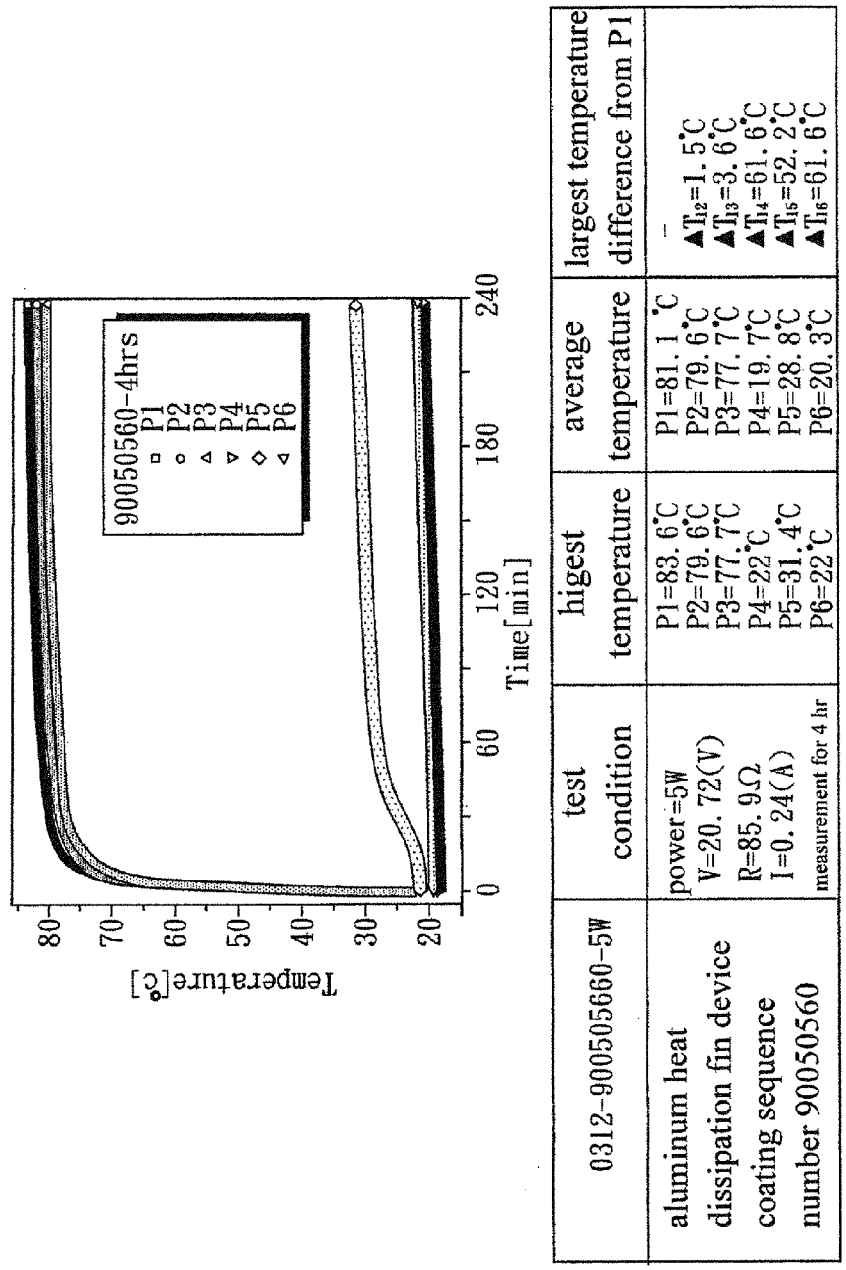
FIG. 3 shows statistic data and curve of tests for a heat dissipation fin device without the composition of the present invention applied to a CPU operation environment.
Figure 4:
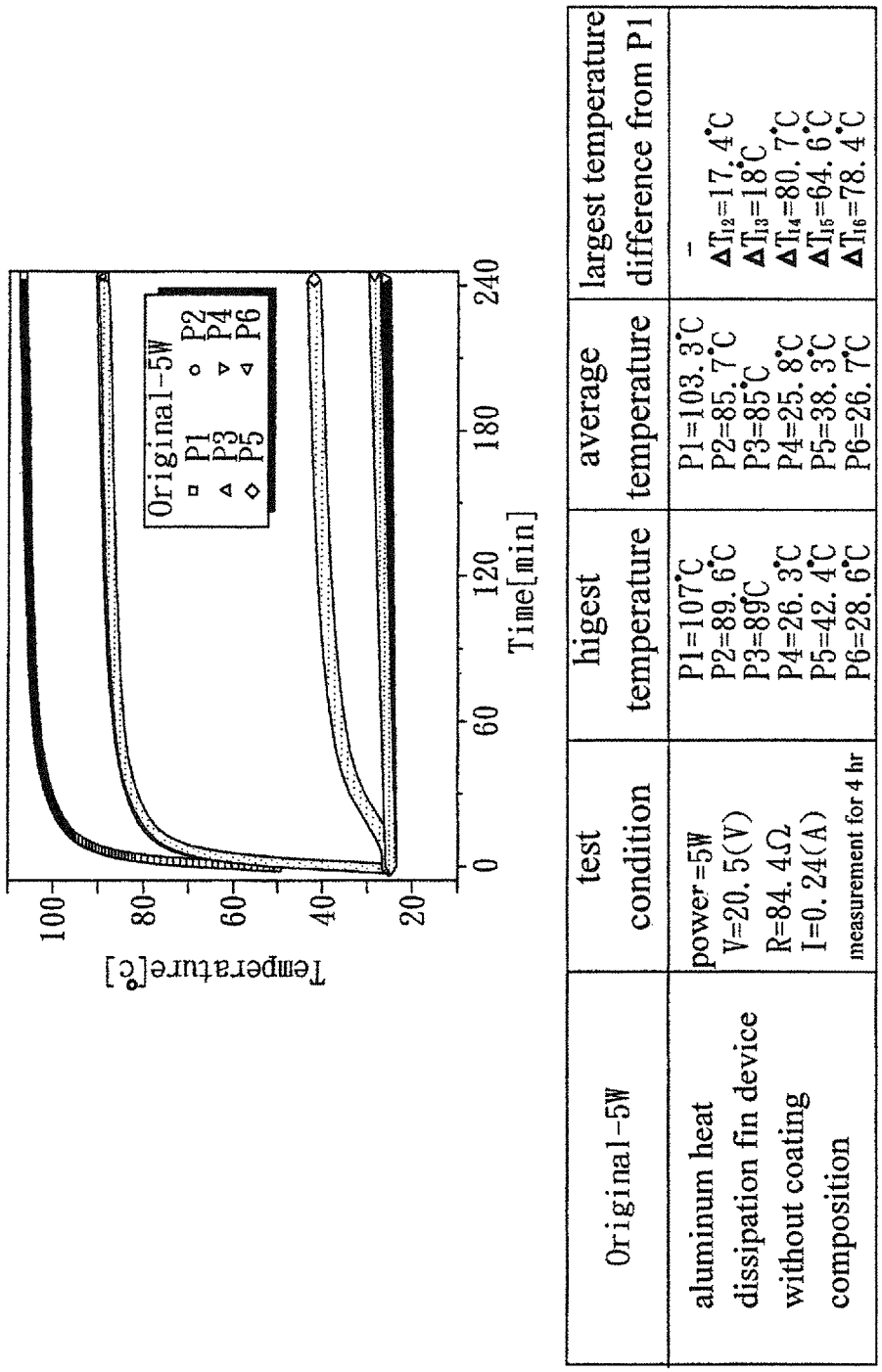
FIG. 4 shows statistic data and curve of tests for a heat dissipation fin device with the composition of the present invention applied to a CPU operation environment.
Figure 5:
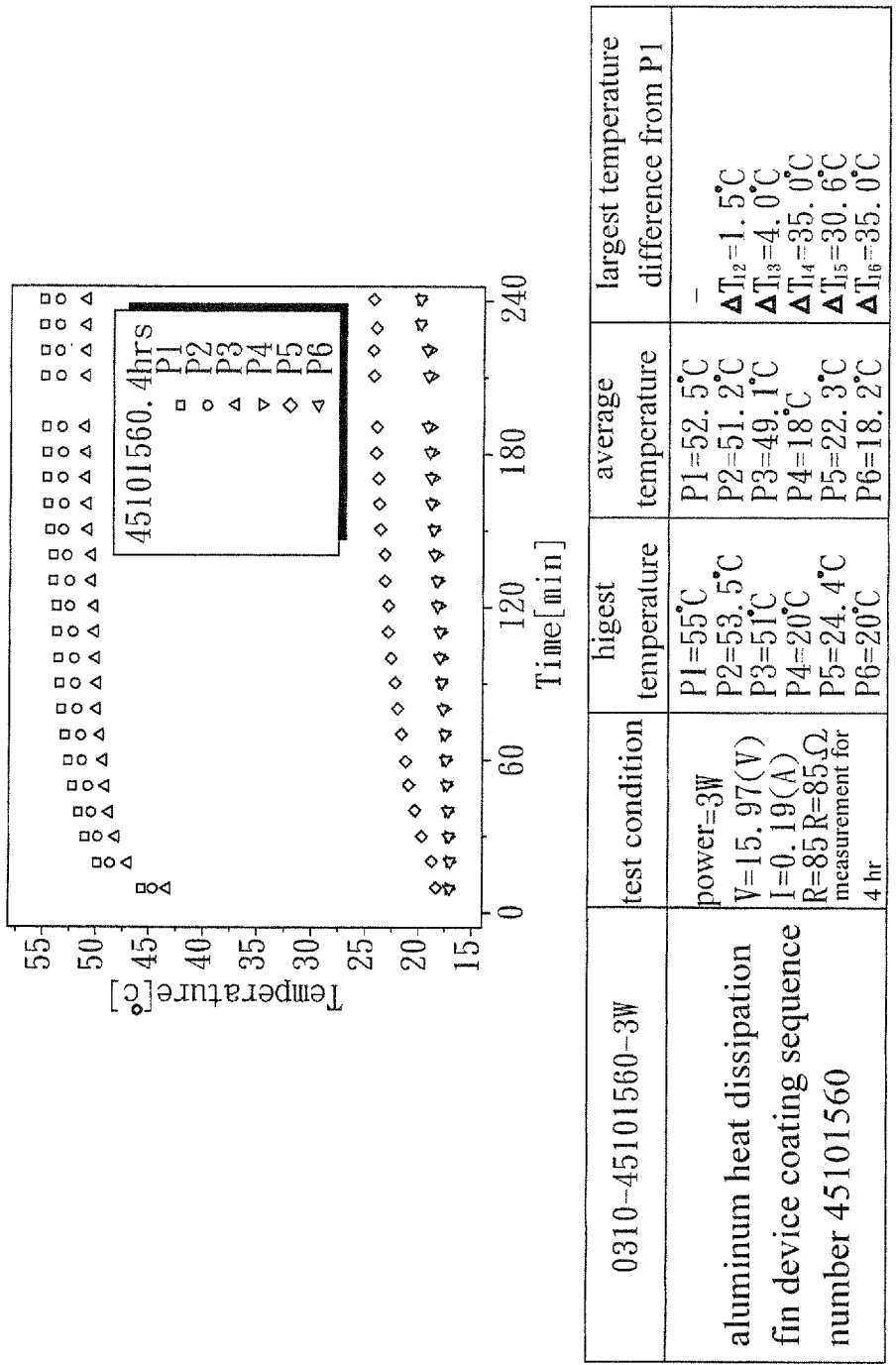
FIG. 5 shows statistic data and curve of tests for a heat dissipation fin device with the composition of the present invention applied to an LED operation environment.

The parameters of the temperature measurement system are set to simulate an operation environment of a central processing unit (CPU) in that an aluminum heat dissipation fin device mounted to the CPU and applied with the composition of the present invention and a reference device of an aluminum heat dissipation fin device that is not applied with the composition of the present invention and is mounted to a CPU are tested for comparison, which give the test result of FIG. 3 for the heat dissipation fin device without the composition of the present invention and applied to an operation environment of CPU and the test result of FIG. 4 for the heat dissipation fin device with the composition of the present invention and applied to an operation environment of CPU. Comparing the curves and statistic data shown in the two figures indicates that from the measurement point P1, the temperatures measured for the device that applies the composition of the present invention are lower than those for the device that does not apply the composition of the present invention. It is clear enough that the device that applies the composition of the present invention shows improved heat dissipation rate and thus provides an increased heat dissipation efficiency, as well as the advantages of good thermal conductivity, improved low temperature radiation, better resistance against high temperature, and stable surface characteristics. In an LED simulation, FIG. 5 shows curves and statistic data for simulation of a heat dissipation fin device with the composition according to the present invention applied to an LED operation environment. Again, excellent heat dissipation result is obtained.

Further, according to the present invention, the resin based coating agent 20 that is added to the double-bond substance can be of the following types:

(1) The resin-based coating agent 20 comprises a roller coating type resin, which is applicable to a roller coating machine for rolling and coating on a plate-like heat dissipater.

(2) The resin-based coating agent 20 comprises a lamination coating type resin, which is applicable to a lamination coating machine for laminating and coating on a plate-like heat dissipater.

(3) The resin-based coating agent 20 comprises a spray coating type resin, which is applicable to a spray coating machine for spraying and coating on a heat dissipater.

(4) The resin-based coating agent 20 comprises an electro-deposition coating type resin, which is mixed with aqueous diluting agent for application in an electro-deposition bath for electroplating a heat dissipater.

It will be understood that each of the elements described above, or two or more together may also find a useful application in other types of methods differing from the type described above.

While certain novel features of this invention have been shown and described and are pointed out in the annexed claim, it is not intended to be limited to the details above, since it will be understood that various omissions, modifications, substitutions and changes in the forms and details of the device illustrated and in its operation can be made by those skilled in the art without departing in any way from the spirit of the present invention.

I claim:

1. A heat dissipation composition that comprises a hydroxy function group contained double-bond substance formed of aromatic hydrocarbons having precursor of benzene, which is mixed with a resin-based coating agent and a diluting agent at predetermined ratios for application on a surface of a heat dissipater to facilitate heat dissipation, whereby when the heat dissipater receives heat to be dissipated, the double-bond substance absorbs the heat and induces displacement to form a resonance structure so as to more efficiently dissipate the heat and when the heat is dissipated, the substance restores the double-bond condition thereby realizing improvement of efficiency of heat dissipation, wherein the double-bond substance comprises 2-hydroxydibenzoacid.

2. The heat dissipation composition according to claim 1, wherein the double-bond substance that is mixed with the resin-based coating agent and the diluting agent at predetermined ratios for application on a surface of a heat dissipater to facilitate heat dissipation, the predetermined ratios being as follows that with an amount of the coating agent being taken as 100 parts to serve as a reference, the double-bond substance is approximately 5-100 parts, making the ratio between the double-bond substance and the coating agent being 5-100:100, the diluting agent being approximately 100-900, making the ratio between the diluting agent and the coating agent being 100-900:100.

3. The heat dissipation composition according to claim 1, wherein the double-bond substance comprises 2-hydroxybenzophenone.

4. The heat dissipation composition according to claim 1, wherein the double-bond substance comprises alkyl 2-cyano-3,3-diphenylacrylate.

5. The heat dissipation composition according to claim 1, wherein the resin-based coating agent comprises a resin applicable on a roller coating machine for rolling and coating on a plate of the heat dissipater.

6. The heat dissipation composition according to claim 1, wherein the resin-based coating agent comprises a resin applicable to a lamination coating machine for laminating and coating on a plate of the heat dissipater.

7. The heat dissipation composition according to claim 1, wherein the resin-based coating agent comprises a resin applicable to a spray coating machine for spraying and coating on a heat dissipater.

8. The heat dissipation composition according to claim 1, wherein the resin-based coating agent comprises a resin, which is mixed with aqueous diluting agent for application in an electro-deposition bath for electroplating a heat dissipater.

* * * * *